United States Patent

Lawrence et al.

[15] 3,670,403

[45] June 20, 1972

[54] THREE MASKING STEP PROCESS FOR FABRICATING INSULATED GATE FIELD EFFECT TRANSISTORS

[72] Inventors: Howard Lawrence, Lafayette; Peter C. Schaefer, Syracuse, both of N.Y.

[73] Assignee: General Electric Company

[22] Filed: March 19, 1970

[21] Appl. No.: 21,161

[52] U.S. Cl. .......... 29/571, 29/578, 156/3, 156/11, 156/17

[51] Int. Cl. .......... B01j 17/00, H01g 13/00

[58] Field of Search .......... 29/571, 578; 156/17

[56] References Cited

UNITED STATES PATENTS 3,566,518 3/1971 Brown et al. .......... 29/578 X 3,475,234 10/1969 Kerwin et al. .......... 29/571 X 3,541,676 11/1970 Brown .......... 29/578 X

*Primary Examiner*—John F. Campbell

*Assistant Examiner*—W. Tupman

*Attorney*—John F. Ahern, Paul A. Frank, Julius J. Zaskalicky, Donald R. Campbell, Frank L. Neuhauser, Oscar B. Waddell and Joseph B. Forman

[57] ABSTRACT

A three resist-masking step process produces lower cost monolithic integrated circuit insulated gate field effect transistors with improved electrical characteristics. To fabricate a metal-nitride-oxide-silicon device, layers of grown oxide, silicon nitride, and field oxide are deposited on a wafer, and the first mask facilitates etching of source and drain openings. After depositing activator impurity and glass, and diffusing, the second mask is used in simultaneously etching contact holes and a gate opening using the silicon nitride as an etch stop. The third mask delineates the contact metallizations.

4 Claims, 7 Drawing Figures

Figure 1:
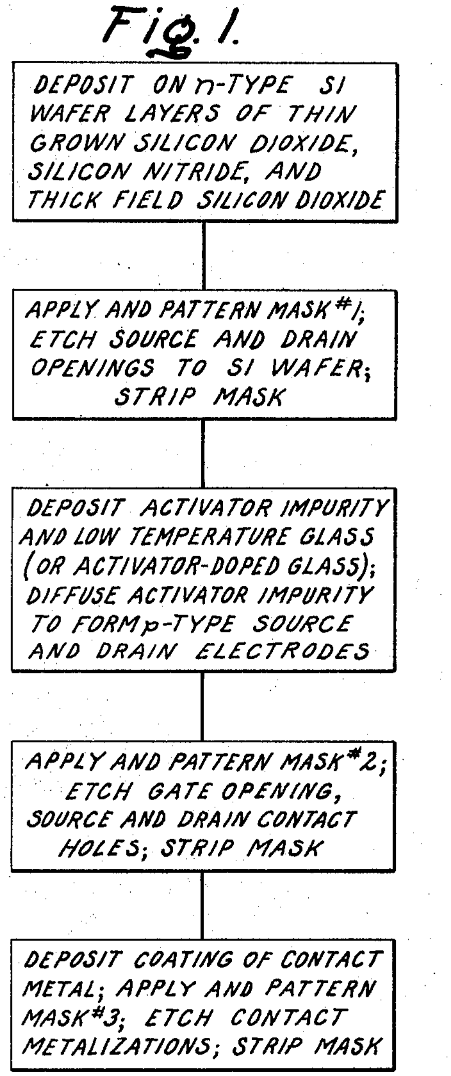

Inventors:
Howard Lawrence,
Peter C. Schaefer,
by Donald R. Campbell
Their Attorney.

THREE MASKING STEP PROCESS FOR FABRICATING INSULATED GATE FIELD EFFECT TRANSISTORS

This invention relates to the fabrication of integrated circuit insulated gate field effect transistors, and more particularly to a manufacturing process that requires only three resist-masking steps. Although not limited thereto, the three masking step process is most advantageously practiced to manufacture silicon devices with a laminate oxide-silicon nitride gate insulator.

The standard processes for manufacturing different types of integrated circuit insulated gate field effect transistors all use four resist-masking steps to protect the underlying areas from the action of etchants during the various intermediate stages in the preparation of the device. In integrated circuit technology, where the dimensions are microscopic, a light sensitive photoresist is almost universally employed as the resist material. The ordinary metal-oxide-semiconductor field effect transistor, known as the MOS transistor, employs a single oxide layer as the gate insulator. Other known varieties of insulated gate field effect transistors use a laminate or sandwich-type gate insulator, such as an oxide-silicon nitride or oxide-aluminum oxide laminate. Another broad classification uses the self-registered gate technology utilizing polycrystalline silicon, molybdenum, or tungsten for the gate electrode. The refractory metal gate electrode in these transistors, known as RMOS transistors, is used as a diffusion mask for activator impurities when forming the conductivity-modified source and drain electrodes in the semiconductor substrate. Regardless as to the type of insulated gate field effect transistor being produced, at least four photoresist masking steps have been required.

To clarify the point, the individual steps in what is believed to be an industry-wide standard process for fabricating the common integrated circuit MOS transistor will be reviewed. A thin layer of silicon dioxide is thermally grown on one surface of a silicon wafer, the first photoresist mask is deposited and patterned, and source and drain openings are etched to provide windows in the passivating film for the predeposition of activator impurity. Following a wet oxidation step to deposit a thick layer of field silicon dioxide over the entire wafer, the activator impurity or dopant is thermally diffused into surface-adjacent regions of the substrate to form the opposite conductivity type source and drain electrodes. As is well known to those skilled in the art, the function of the thick field oxide in the finished monolithic device is to support the metallic interconnect patterns needed to connect the transistor in a circuit, without electrical interference with the device. The next step in the processing sequence after diffusion is to apply and pattern the second photoresist mask, and remove both the thick field oxide and the underlying passivating oxide in the gate region and overlapping source and drain regions. A second thin silicon dioxide gate insulator layer is now regrown on the exposed wafer surface in the gate opening. The third photoresist mask is applied and defines the pattern for etching contact holes through the field oxide to the source and drain electrodes. Finally, contact metallization is deposited over the entire surface, and a fourth photoresist mask is patterned to permit selective etching of the metallization to form electrically isolated source, gate, and drain contacts.

The standard process for fabricating an insulated gate field effect transistor with an oxide-silicon nitride or silicon oxynitride dielectric is identical except that the additional insulator layer is deposited over the regrown oxide before cutting the gate. The preferred embodiments of this invention are disclosed with regard to this type of transistor. A problem with either four masking step standard process is premature electrical breakdown at the overlap of the source and drain electrodes with the gate electrode. During the thermal regrowing of the oxide gate insulator the oxide combines with the substrate material and draws out some of the activator impurity, and there is also thermal diffusion of the impurity into the oxide, the result being a less effective dielectric at the overlap regions.

Accordingly, an object of the invention is a simplified, lower cost, three resist-masking step process for fabricating insulated gate field effect transistors.

Another object is an improved three masking step process compatible with a processing sequence that avoids the critical oxide regrowth step of prior art processes.

Yet another object is to fabricate insulated gate field effect transistors, and in particular transistors with an oxide-silicon nitride gate dielectric, with improved electrical characteristics including a reduction of oxide breakdown at the source and drain overlap with the gate dielectric.

In accordance with the invention, a three resist-masking step process for fabricating an integrated circuit insulated gate field effect transistor comprises initially depositing on one surface of a semiconductor substrate of one conductivity type one or more thin gate insulator layers and a thick field insulator layer. For a silicon device the gate insulator is preferably a laminate of grown silicon dioxide and silicon nitride, and the field insulator is pyrolytically deposited silicon dioxide. After applying a first patterned resist-mask, source and drain openings are formed, as by etching, through the deposited insulator layers down to the substrate surface. The processed wafer is now prepared for diffusion by depositing a coating of activator impurity and insulator, and the activator impurity is diffused into the semiconductor substrate to form opposite conductivity type source and drain electrodes. After applying the second patterned resist-mask, source and drain contact holes and a gate opening therebetween are formed simultaneously using the gate insulator layer (silicon nitride) as a stop in the gate region. The third patterned resist-mask is applied incident to the formation of electrically isolated contact metallizations by conventional techniques.

Figure 2A:
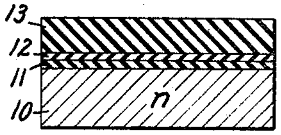
Figure 2B:
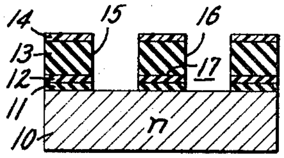
Figure 2C:
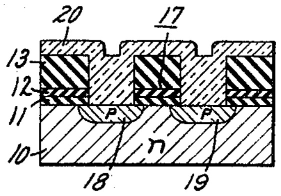
Figure 2D:
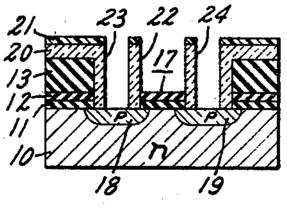
Figure 2E:
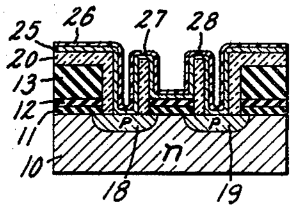
Figure 3:
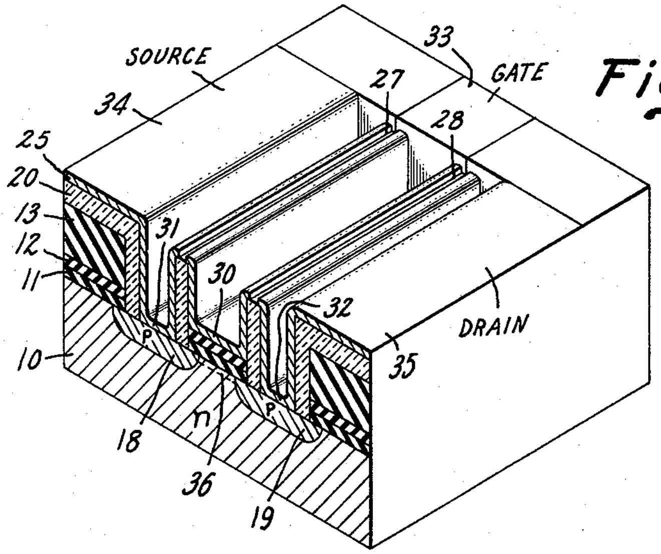

The foregoing and other objects, features, and advantages of the invention will be apparent from the following more particular description of several preferred embodiments of the invention, as illustrated in the accompanying drawing wherein:

FIG. 1 is a process flow diagram showing the main steps in preparing insulated gate field effect transistors in accordance with the invention;

FIGS. 2*a*–2*e* illustrate in elevation a semiconductor body during the various steps of the performance of the process shown by the flow diagram of FIG. 1 at the corresponding stages; and FIG. 3 is an isometric view of the completed monolithic integrated circuit metal-nitride-oxide-semiconductor field effect transistor.

The semiconductor fabrication technique to be described can be used to manufacture both *n*-channel and *p*-channel integrated circuit insulated gate field effect transistors, either the enhancement mode type or the depletion mode type. For purposes of illustration, there is discussed the fabrication of a silicon *p*-channel, enhancement mode, metal-nitride-oxide-semiconductor field effect transistor. It will be understood, however, that within the scope of the invention the gate dielectric can be made of other insulators provided they have differential etching characteristics as will be further explained, and the process is also applicable to semiconductors other than silicon, such as germanium and gallium arsenide. The fabrication of only one semiconductor device is discussed but in practice it is contemplated that an array of monolithic integrated circuit transistors are manufactured simultaneously.

Referring to the flow diagram of FIG. 1 and the corresponding stages in the preparation of the semiconductor device shown in FIGS. 2*a*–2*e*, the various steps are performed upon one surface of an n-type silicon substrate 10. Only a small portion of substrate 10 is illustrated, which is typically a flat, thin silicon wafer having a thickness of about 6–12 mils and a diameter of 1 inch to 1 ½ inches. The first step in the processing sequence (FIG. 2*a*) is to deposit on one surface of substrate 10 a thin thermally grown layer 11 of silicon dioxide ($SiO_2$). On top of grown oxide layer 11 is deposited a thin film 12 of silicon nitride ($Si_3N_4$), or silicon oxynitride, an amorphous mixture of silicon, oxygen, and nitrogen. On this laminate, which serves as the gate insulator in the completed device, there is deposited a thick field insulator layer 13 preferably comprised of pyrolytically deposited silicon dioxide. As will presently be clarified, the requirement is made that the subsequently deposited field insulator 13 be selectively etchable with respect to the gate insulator. While it is possible to use a single gate insulator layer made entirely of thermally grown silicon dioxide, silicon nitride, silicon oxynitride, or some other suitable deposited insulator, or a laminate with more than two layers, the preferred arrangement is a silicon dioxide silicon nitride laminate. The use of silicon nitride in the process is advantageous because this insulator material is highly dense, is impervious to alkali ion contamination, and is not etched or is only slowly etched by the etchants commonly used in semiconductor preparation. By way of example, the thickness of each of the deposited films 11, 12 of gate insulator silicon dioxide and silicon nitride is about 1,000 A. or less, while the thick field oxide layer 13 is about 10,000 to 15,000 A. in thickness. Conventional techniques are used to fabricate the various layers.

The next step in the process sequence (FIG. 2*b*) is to form source and drain openings 15 and 16 at either side of the intended gate region 17 by etching entirely through the three superimposed layers 11–13 down to the surface of silicon wafer 10. This is accomplished by coating the upper surface of thick oxide layer 13 with a thin film 14 of photoresist, patterning the photoresist, and etching away the portions of layers 11–13 not protected by the patterned photoresist film that correspond to the desired openings. This is the first photoresist mask in the three masking step process. Any suitable photoresist compound can be used, many of which are available and well known to the art. A specific photoresist is sold under the tradename KMER by Eastman Kodak Company of Rochester, New York, and is described in the Eastman Kodak Company publication, "Photosensitive Resists for Industry," published in 1962. To further explain a typical technique for applying and patterning the KMER photoresist, a thin film of the liquid compound is applied to the surface of the processed wafer on a spinner. The photoresist is prebaked, exposed through a patterned mask to light of a wavelength to which the photographic compound is sensitive, and post-baked. During the exposure operation, light reacts with the photoresist material to initiate polymerization of the photoresist. The exposed wafer is then immersed in a developer, such as KMER photoresist developer furnished by the Eastman Kodak Company, and washed with isopropyl alcohol to stop the reaction. The developer causes the unexposed portions of the photoresist to dissolve away, leaving a mask composed of a protective layer of hardened photoresist over all but those portions of the silicon wafer which constitute the source and drain openings 15, 16 to be formed. Following the etching operation, the photoresist mask is removed either mechanically or chemically. A nitric acid-sulfuric acid bath, for example, accomplishes chemical stripping of the mask.

In order to form drain and source openings 15 and 16, it is necessary to use different etching acids to etch through the superimposed deposited layers 11–13. As was previously mentioned, it is essential that field insulating layer 13 and uppermost gate insulator layer 12 have differential etching characteristics. One etchant that removes the field oxide layer but is substantially unreactive with the silicon nitride layer is buffered hydrofluoride, containing approximately 1 volumetric part HF to 10 parts of ammonium fluoride. Silicon nitride is then etched with phosphoric acid, for example, and the remaining layer 11 of grown silicon dioxide is removed with buffered HF.

The silicon wafer is next subjected to a diffusion step (FIG. 2c) to form the heavily doped *p*-type source and drain electrodes 18 and 19 in and adjacent to the surface of the wafer. Two process variations are possible at this point and both are well known to those skilled in the art. One diffusion technique comprises predepositing an activator impurity on the surface of the wafer within openings 15 and 16, depositing a low temperature glass coating 20 at about 350°-400° C. over the entire surface, and finally heating in an inert gas atmosphere at temperatures of 1,000° to 1,500°C to thermally diffuse the impurity into the substrate to form p-type source and drain electrodes 18 and 19. The activator impurity commonly used is boron. To form *n*-diffusions, phosphorus is commonly used, and other donor and acceptor activator impurities or dopants in general are the Group III or Group V elements as is well known in the art. The alternative diffusion technique is to coat the entire surface of the processed wafer with an activator-doped glass (same as layer 20) containing a minor quantity of donor or acceptor impurity. To form p-type source and drain electrodes, as in the present instance, $SiO_2$ doped with the order of 1 percent boron is deposited into drain and source openings 15 and 16 and over the surface of the patterned thick oxide layer 13. The glass-coated wafer is then heated for a suitable time and at a suitable temperature to cause the activator atoms to diffuse into the surface of substrate 10. As is evident in FIG. 2*c*, there is diffusion laterally beyond the boundaries of source and drain openings 15 and 16, and in particular there is some lateral diffusion beneath each end of the intended gate region 17.

An important feature of the three masking step process is that the gate opening and contact holes to the source and drain electrodes are formed simultaneously in one step. This is possible because the initially grown oxide gate insulator is never removed, making subsequent oxidation unnecessary. Referring to FIG. 2*d*, the second photoresist mask 21 is applied to the surface of the wafer and patterned in the manner previously described in detail. Mask 21 has three apertures corresponding to the intended gate opening 22, and the intended source and drain contact holes 23 and 24 to be made in glass coating 20. An etchant is used, such as buffered HF, that is substantially non-reactive with both silicon and silicon nitride, since silicon nitride layer 12 is used as an etch stop when making the gate opening. In view of the chemical similarity of glass coating layer 20 and thick field oxide layer 13, the same etchant attacks both layers, and the gate cut is made slightly undersized so as to assure not going beyond the boundaries of silicon nitride layer 12 in the gate region 17. Photoresist mask 21 is now stripped off.

The third and final photoresist mask is used to define the contact metallizations. Ordinarily the contact metallization step is carried out by depositing a thin film 25 (FIG. 2*e*) of an appropriate contact metal such as aluminum or molybdenum over the entire surface of the processed wafer. Third photoresist mask 26 is deposited on the surface of metallic film 25 and exposed in a pattern to define two longitudinally extending slots 27 and 28 at either side of the gate and the proper interconnect pattern. After etching with a suitable aluminum or molybdenum etch, the contact metallization is divided into three distinct, electrically isolated areas. By depositing the contact metallization in this manner (see FIG. 3), gate contact metallization 30 and source and drain contacts 31 and 32 are formed simultaneously with the respective elevated contact pads 33–35. The contact pads 33–35 are, of course, formed on top of the thick field insulating layers provided by thick field oxide layer 13 and glass coating layer 20, in order to minimize contact capacitance in the finished structure.

FIG. 3 also shows diagrammatically the preferred rectangular geometry of the completed device. As was mentioned, ordinarily an array of monolithic integrated circuit semiconductor devices identical to the one device illustrated are manufactured simultaneously. Typical dimensions for the metal-nitride-oxide-semiconductor field effect transistor shown in FIG. 3 are that the source and drain electrodes 18 and 19 are each about 0.55 to 0.75 mils in length, while the *p*-channel 36 formed between them when a voltage of appropriate polarity and magnitude is applied to gate contact 30 has a length of about 0.25 to 0.8 mils. The orthogonally related widthwise dimension of p-channel 36, and of the entire device, is about 0.3 to 1.0 mils. The actual dimensions of a particular device depend upon the circuit application. The monolithic integrated circuit interconnect patterns needed to connect the transistor in a circuit, or make connection to contact pads at the side of the chip, are deposited upon the field insulating layers and make connection to contact pads 33–35. In operation, assuming that a d-c voltage of the appropriate polarity is connected between source and drain contacts 31 and 32, the device is changed from its non-conducting to its conducting state when a negative voltage exceeding the threshold voltage is applied to gate contact 30. An electric field is created in the gate insulator layers 11, 12, and that portion of the electric field which exists in substrate 10 attracts holes from the body of the substrate toward its surface, creating *p*-channel 36 by the process of inversion. The previous *p-n-p* configuration is changed to a *p-p-p* configuration, and a current passes between source and drain electrodes 18 and 19. As the magnitude of the gate voltage increases, the conductance of the channel increases.

The most important and advantageous feature of the new and improved processing sequence for fabricating integrated circuit insulated gate field effect transistors is that only three resist-masking steps are needed, as opposed to the four masking steps used in the prior art standard processes. The elimination of a complete masking step, including applying, exposing, developing, and stripping the photoresist, results in a lower cost and simplified processing. In particular, the separate masks formerly required to make the gate opening and then to open the contact holes are not needed, since in the present process gate opening 22 and contact holes 23 and 24 are cut at the same time (see FIG. 2*d*) using the upper insulating layer 12 as an etch stop. To achieve this improvement, field insulating layer 13 is placed over the gate dielectric sandwich 11, 12 in the first step (FIG. 2*a*). After forming source and drain openings 15 and 16 (FIG. 2*b*), and the steps relating to thermal diffusion of the activator impurity to form source and drain electrodes 18 and 19 (FIG. 2*c*), the wafer is in condition to cut through the field oxide to make the gate opening 22, and to cut through the glass layer 20 used in the diffusion step to form drain and source contact holes 23 and 24. Subsequent oxidation to form the oxide gate insulator is unnecessary, since the originally applied insulator layers 11, 12 remain in place throughout the entire processing. Thus, the most efficient cleaning procedures can be used for thermally grown thin silicon dioxide gate insulator layer 11. The long, eight-hour, wet oxidation step of the prior art standard process is eliminated since the field oxide is already there.

In addition to lower cost and simplified processing, the transistor that is produced has improved electrical characteristics. In the three masking step process, the source and drain electrodes 18 and 19 diffuse under the gate insulator layers in gate region 17 (FIG. 2*c*). Overlap of the gate over the source and drain electrodes, it will be noted, is required in a properly operated enhancement mode device. This eliminates the necessity of making the gate cut over the high impurity concentration regions, as is done in the standard prior art four masking step processes, where the subsequent regrowth of the thin gate oxide layer has been found to be a source of premature voltage breakdown. With the new process, proper overlap of the gate dielectric with the source and drain electrodes is accomplished without the undesirable feature of premature breakdown. Devices made by the new three masking step process further have higher sheet resistance, which is a measure of the electrical conductivity of the semiconductor material. The higher sheet resistance results from the fact there is no oxidation step following the diffusion steps in the three masking step process. In the older four masking step standard processes, the growing of an oxide layer subsequent to diffusion causes the impurity to be drawn out of the silicon substrate as the oxide is formed. Also, some impurity is lost due to being driven out by the oxidizing temperatures. A higher sheet resistance results in a lower junction breakdown characteristic, and thus a better protection device is possible. As a final advantage, there is true planar processing. No openings to bare silicon are made in critical areas, once the thin gate oxide layer is grown, allowing for the most efficient cleaning procedures to be used at the first step. The gate oxide is then immediately sealed with silicon nitride.

Each individual operation in the semiconductor processing can be performed by conventional state-of-the-art techniques. The invention lies in the particular sequence of steps in order to produce a unique three masking step fabrication process, and a unique device. By way of example of the practice of the invention, the fabrication of a *p*-channel, enhancement mode, metal-nitride-oxide-semiconductor field effect transistor, which is the preferred embodiment of the invention, will be described in greater detail than is given above. Referring to FIG. 2*a*, the grown gate insulator silicon dioxide layer 11 has a thickness of 700 A. and is thermally grown in a furnace in an oxygen atmosphere at a temperature of about 1,200° C. Silicon nitride film 12 is pyrolytically deposited to a thickness of about 500 A. by reacting silane with ammonia in a reactor at 950° C. The thick field silicon dioxide layer 13 is now pyrolytically deposited in a furnace at a temperature of about 850° C. for 40 minutes to a thickness of about 12,000 A.

First photoresist mask 14 (FIG. 2*b*) is applied and patterned in the manner previously described in detail. To etch source and drain openings 15 and 16, the wafer is first immersed in a buffered HF bath to etch thick oxide layer 13. This etchant is substantially non-reactive with silicon nitride, and to etch silicon nitride layer 12 the wafer is transferred to a hot phosphoric acid solution where the etching proceeds in a closed system so that water does not evaporate from the acid at 155°–160° C. To etch thin grown silicon dioxide layer 11, the wafer is returned to the buffered HF solution. Mask 14 is now chemically stripped.

The two process variations for the diffusion steps have already been discussed. In one variation, a thin film of boron is thermally deposited in a furnace on the surface of substrate 10 within drain and source openings 15 and 16. Low temperature glass coating 20 is deposited pyrolytically on the surface of the wafer to a thickness of about 12,000 A. in a reactor at about 350°–400° C. At this low temperature, the predeposited boron film does not diffuse into the surface of the wafer. Thermal diffusion of the boron impurity to form heavily doped source and drain regions 18 and 19 is accomplished in a furnace in an inert gas atmosphere, such as helium, at about 1,200° C for 20 minutes. The alternative diffusion technique is to deposit on the surface of the wafer into source and drain openings 15 and 16 a layer of "doped" glass containing a minor quantity of boron impurity. The glass-coated wafer is then heated for a suitable time, as for example, 4 hours, and at a suitable temperature, for example 1,150° C, to cause the activator atoms to diffuse into substrate 10. As is well known in the art, the temperature and time of diffusion vary with such factors as the thickness of the doped glass film, the depth of penetration desired, and the crystal orientation.

The second photoresist mask 21 is deposited and patterned to define gate, source, and drain openings 22–24. The gate opening and contact holes are etched simultaneously by immersing the wafer in a buffered HF bath, using silicon nitride layer 12 as an etch stop in the gate region. Photoresist region mask 21 is then stripped. A step not previously mentioned is a hydrogen anneal, performed in a furnace in a hydrogen atmosphere at 700° C. for one-half hour. Silicon nitride at high temperatures is sometimes unstable, and this extra step stabilizes the unit. Referring to FIG. 2*e*, a thin film 25 of a suitable contact metal, such as aluminum or molybdenum, is next deposited over the entire surface of the wafer by a standard sputtering or vacuum evaporation process. The third photoresist mask 26 is deposited and patterned, and slots 27 and 28 are etched out in an aluminum or molybdenum etch comprising, for example, 16 parts phosphoric acid, 1 part nitric acid, 1 part acetic acid, and 2 parts water. The third photoresist mask 26 is chemically removed in the same manner as the other masks.

In summary, the three resist-masking step process for fabricating integrated circuit insulated gate field effect transistors achieves lower cost, simplified processing while yet producing a device with improved electrical characteristics. To practice the process, the gate dielectric and an overlying thick field insulator layer are deposited on the semiconductor wafer as the initial steps and are not subsequently disturbed. The first mask facilitates cutting of source and drain openings to the wafer surface. After diffusion, in which a low temperature glass coating or an activator-doped glass is deposited in the source and drain openings, the second mask is used to define the gate opening and contact holes to the source and drain. As a departure from prior art standard processes, the gate opening and source and drain contact holes are etched simultaneously using the gate dielectric as the etch stop. The third resist mask, in well-known fashion, defines the contact metallization patterns. The new three masking step process is suitable for producing low cost arrays of monolithic integrated circuit insulated gate field effect transistors for applications such as digital and linear circuitry. The process in an appropriate case can be practiced with resist-masks made of materials other than photoresists, such as patterned metallic films used as resist-masks.

While the invention has been particularly shown and described with reference to several preferred embodiments thereof, it will be understood by those skilled in the art that various changes in form and detail may be made therein without departing from the spirit and scope of the invention.

What we claim as new and desire to secure by Letters Patent of the United States is:

1. A three resist-masking step process for fabricating an integrated circuit insulated gate field effect transistor comprising the steps of depositing on a surface of a semiconductor substrate of one conductivity type a thin gate insulator layer and an overlying thick field insulator layer, forming drain and source openings through said deposited insulating layers down to the substrate surface, preparing the processed substrate for diffusion by depositing a coating of activator impurity and insulator at least in said source and drain openings, and diffusing the activator impurity into said semiconductor substrate to form opposite conductivity type source and drain electrodes, simultaneously forming source and drain contact holes and a gate opening therebetween using said thin gate insulator layer as a stop, and depositing source, gate, and drain contact metallizations such that portions of said contact metallizations overlie said thick field insulator layer, said thick field insulator layer having sufficient thickness to prevent electrical interference with the underlying transistor.

2. A process according to claim 1 wherein a first resist-mask is deposited incident to the forming of said source and drain openings, a second resist-mask is deposited incident to the forming of said gate opening and source and drain contact holes, and a third resist-mask is deposited incident to the deposition of said contact metallizations, each of said masks being removed at an appropriate point in the process.

3. A process according to claim 2 wherein said semiconductor substrate is made of silicon, said thin gate insulator comprises a laminate of grown silicon dioxide and silicon nitride, and said thick field insulator comprises pyrolytically deposited silicon dioxide.

4. A three resist-masking step process for fabricating an integrated circuit insulated gate field effect transistor comprising the steps of depositing on one surface of a silicon substrate of one conductivity type thin gate insulating layers of grown silicon dioxide and silicon nitride, and an overlying thick field silicon dioxide layer, applying a first patterned photoresist mask and etching source and drain openings through said insulating layers down to the substrate surface, preparing the processed substrate for diffusion by depositing a coating of activator impurity and glass at least in said source and drain openings, and thermally diffusing the activator impurity into said silicon substrate to form opposite conductivity type source and drain electrodes, applying a second patterned photoresist mask and simultaneously etching source and drain contact holes and a gate opening therebetween using said silicon nitride layer as an etch stop, depositing a metallization layer over the entire surface of the processed substrate, and applying a third patterned photoresist mask and etching said metallization layer into electrically isolated source, gate, and drain contact metallizations such that portions of said contact metallizations overlie said thick field silicon dioxide layer, said thick field silicon dioxide layer having sufficient thickness to prevent electrical interference with the underlying transistor, said photoresist masks being removed individually at an appropriate point in the process.

* * * * *